(12) United States Patent
Sukegawa et al.

(10) Patent No.: US 8,686,792 B2
(45) Date of Patent: Apr. 1, 2014

(54) AMPLIFYING DEVICE

(75) Inventors: Rintaro Sukegawa, Kanagawa (JP);
Seigo Ozaki, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/381,213

(22) PCT Filed: Jan. 5, 2011

(86) PCT No.: PCT/JP2011/000013
§ 371 (c)(1),
(2), (4) Date: Dec. 28, 2011

(87) PCT Pub. No.: WO2011/083758
PCT Pub. Date: Jul. 14, 2011

(65) Prior Publication Data
US 2012/0262232 A1    Oct. 18, 2012

(30) Foreign Application Priority Data

Jan. 7, 2010    (JP) .................................. 2010-001695

(51) Int. Cl.
*H03G 3/20*    (2006.01)
(52) U.S. Cl.
USPC ............................. 330/136; 330/127; 330/297
(58) Field of Classification Search
USPC ......................................... 330/136, 127, 297
See application file for complete search history.

(56) References Cited

U.S. PATENT DOCUMENTS

| | | | |
|---|---|---|---|
| 6,043,707 A * | 3/2000 | Budnik | 330/10 |
| 6,696,866 B2 * | 2/2004 | Mitzlaff | 327/50 |
| 6,937,094 B2 * | 8/2005 | Khanifar et al. | 330/129 |
| 7,454,179 B1 * | 11/2008 | Lee | 455/127.1 |
| 7,761,066 B2 * | 7/2010 | Sutardja | 455/127.1 |
| 7,990,214 B2 * | 8/2011 | Markowski | 330/136 |
| 8,154,341 B2 * | 4/2012 | Ishikawa et al. | 330/136 |
| 8,198,941 B2 * | 6/2012 | Lesso | 330/297 |

(Continued)

FOREIGN PATENT DOCUMENTS

| | | |
|---|---|---|
| DE | 19858963 A1 | 7/2000 |
| DE | 101 40 258 A1 | 2/2003 |
| EP | 11 73 1756 | 12/2013 |
| GB | 2 360 410 A | 9/2001 |
| JP | 03-053602 | 3/1991 |
| JP | 2007-508731 | 4/2007 |
| JP | 2007-511187 | 4/2007 |
| JP | 2007-243927 A | 9/2007 |
| JP | 2009-152904 A | 7/2009 |
| JP | 2009-177640 A | 8/2009 |
| WO | WO 2008/024666 A2 | 2/2008 |
| WO | WO 2009/019459 A1 | 2/2009 |

OTHER PUBLICATIONS

International Search Report for International Application No. PCT/JP2011/000013, Mar. 22, 2011, Panasonic Corporation.

*Primary Examiner* — Patricia Nguyen
(74) *Attorney, Agent, or Firm* — RatnerPrestia

(57) ABSTRACT

A supply voltage controller 11 includes a simplified envelope creating unit 111 that calculates an envelope of an input audio signal according to an input audio signal from an external device, creates a supply voltage control signal so that a waveform of the supply voltage control signal follows a waveform of the envelope, and outputs the supply voltage control signal to a voltage variable power supply 12 a constant time before the input audio signal is amplified by the amplifier 14. Accordingly, an amplifying device can be provided which can reduce the distortion of the output signal not depending on a change in the slew rate of the voltage variable power supply 12 and suppress the deterioration of power efficiency.

3 Claims, 5 Drawing Sheets

(56) References Cited

U.S. PATENT DOCUMENTS

| | | |
|---|---|---|
| 2005/0110562 A1 | 5/2005 | Robinson et al. |
| 2007/0109044 A1 | 5/2007 | Nielsen et al. |
| 2007/0178854 A1 | 8/2007 | Sutardja |
| 2007/0178860 A1 | 8/2007 | Sutardja |
| 2009/0160548 A1 | 6/2009 | Ishikawa et al. |
| 2009/0191923 A1 | 7/2009 | Fudaba et al. |
| 2010/0219888 A1 | 9/2010 | Lesso |
| 2011/0221533 A1 | 9/2011 | Lesso |

* cited by examiner

AMPLIFYING DEVICE

This Application is a U.S. National Phase Application of PCT International Application PCT/JP2011/000013.

TECHNICAL FIELD

The present invention relates to an amplifying device that amplifies an electric power of an input signal, and particularly to an amplifying device that controls a supply voltage of a power supply in a power amplifier stage of a signal.

Up to now, in order to increase or decrease a supply voltage value applied to a power amplifier stage following an input signal to an amplifying device, reduce noise superimposed on an output signal and improve the power efficiency of a power supply, there has been a technique in which a voltage variable power supply is used as a power supply of the amplifying device.

In the above technique, the supply voltage applied to the power amplifier stage follows the input signal whereby when the input signal is a small signal, the supply voltage in the power amplifier stage is decreased to a voltage value matching the input signal amplitude. For that reason, noise superimposed on the output signal of the amplifying device can be reduced, and the power efficiency of the power supply can be improved.

Taking an on-vehicle amplifying device into consideration, because a vehicle interior space and a battery of a vehicle are limited, it is desirable that an on-vehicle device is reduced in size and weight and reduced in power consumption. If the power efficiency of the device is enhanced, parts such a heat sink for countermeasures against heat can be downsized or reduced. Also, the power consumption of the device can be suppressed by enhancing the power efficiency. Therefore, the enhancement of the power efficiency is greatly advantageous to the on-vehicle device.

As a conventional voltage variable source, there is a disclosure that a voltage source applies a first drive voltage component that follows an absolute value of an amplified input reference (for example, refer to Patent Literature 1).

Also, a power amplifier is disclosed in which a digital buffer stores a copy of an input signal indicative of a time interval determined in advance, and an envelope profiler analyzes the interval of the buffered input signal, and determines a supply signal profile suitable for the amplifier over the time interval determined in advance (for example, refer to Patent Literature 2).

CITATION LIST

Patent Literature

Patent Literature 1: JP-T-2007-508731
Patent Literature 2: JP-T-2007-511187

SUMMARY OF INVENTION

Technical Problem

However, the conventional amplifying device suffers from the following problems.

According to the disclosure of Patent Literature 1, a supply voltage is controlled according to a value obtained by adding a fixed headroom to a value obtained by multiplying the absolute value of the input signal by a constant. However, when the fixed headroom is underestimated, if the input signal is rapidly changed, the supply voltage of the power amplifier cannot follow a change in the input signal whereby the output signal of the power amplifier stage is distorted. Also, when the fixed headroom is estimated to be high assuming the rapid change of the input signal, the power efficiency of the power supply is degraded.

According to the disclosure of Patent Literature 2, the variable supply voltage signal is generated on the basis of a slew rate of voltage variable power supply to control the supply voltage of the power amplifier stage. However, when the slew rate of the voltage variable power supply is decreased by load fluctuation, the voltage variable power supply cannot respond to the variable supply voltage signal, and the output signal of the power amplifier stage is distorted.

An object of the present invention is to provide an amplifying device that can control a supply voltage following the input signal, which is capable of reducing the distortion of the output signal not depending on a change in the slew rate of the voltage variable power supply and suppressing the deterioration of the power efficiency with no need to consider the above-mentioned fixed headroom.

Solution to Problem

According to the present invention, there is provided an amplifying device that amplifies an input audio signal input to the subject device and outputs a sound, the amplifying device including: a signal delay processor that outputs the input audio signal with a predetermined time of delay; an amplifier that amplifies a signal output from the signal delay processor; a voltage variable power supply that supplies a power to the amplifier; and a supply voltage controller that outputs a supply voltage control signal to the voltage variable power supply to control an output voltage of the voltage variable power supply, in which the supply voltage controller calculates an envelope of the input audio signal from the input audio signal to generate the supply voltage control signal so that a waveform of the supply voltage control signal follows a waveform of the envelope, and outputs the supply voltage control signal to the voltage variable power supply before a constant time prior to the predetermined time.

Advantageous Effects of Invention

According to the present invention, there is no need to consider the fixed headroom provided in the supply voltage applied from the voltage variable power supply to the amplifier stage. Also, even when the slew rate of the voltage variable power supply fluctuates due to the load fluctuation, the supply voltage control that allows the supply voltage to surely follow the input signal can be performed. For that reason, noise superimposed on the output signal of the amplifying device can be reduced more than that in the conventional art. Also, the amplifying device can be provided which improves the power efficiency of the voltage variable power supply.

DESCRIPTION OF EMBODIMENTS

First Embodiment

Hereinafter, an amplifying device according to a first embodiment of the present invention will be described with reference to drawings.

Figure 1:
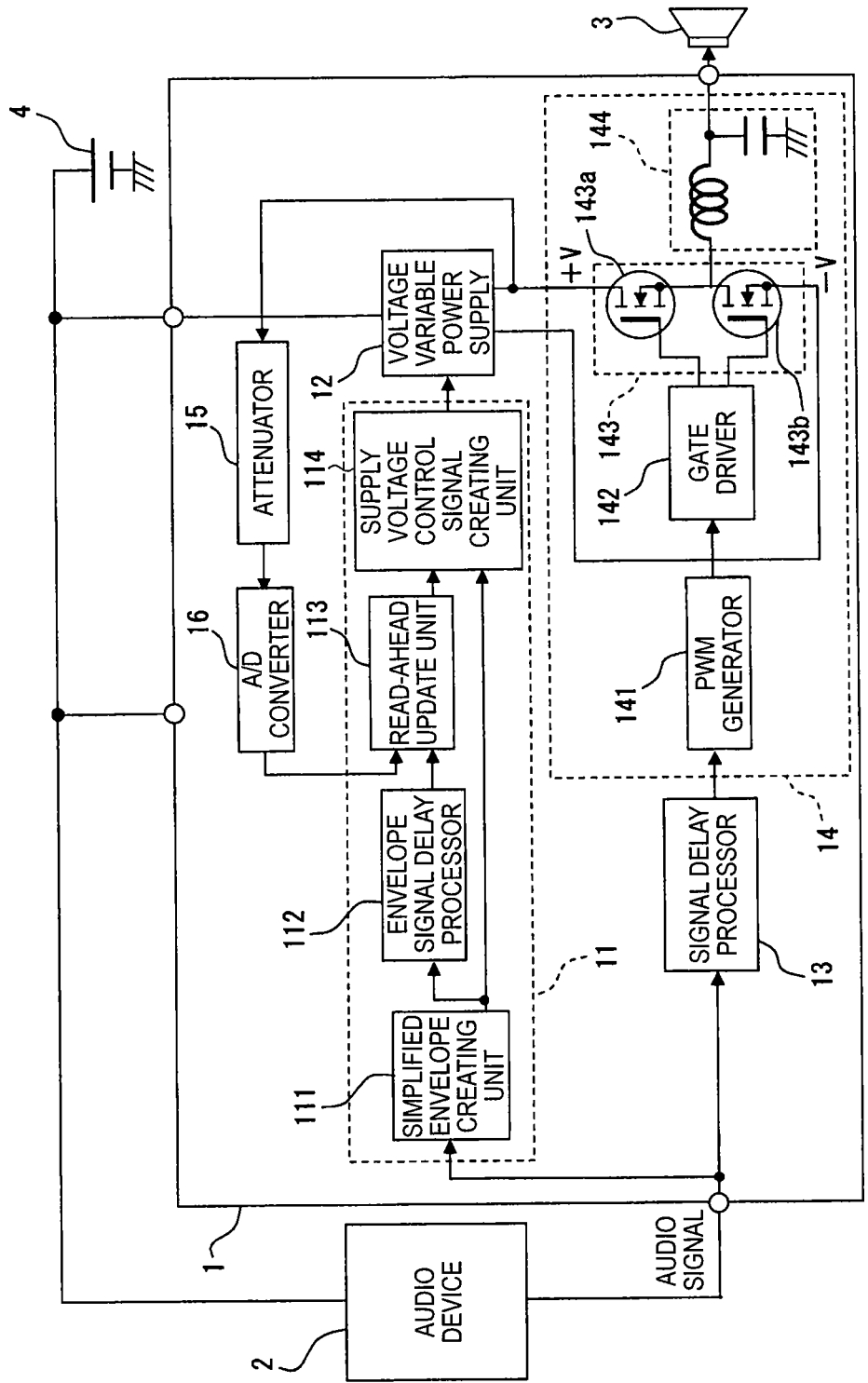
FIG. 1 is a block diagram illustrating respective functions of an amplifying device according to a first embodiment of the present invention.

FIG. 1 is a block diagram illustrating respective functions of the amplifying device according to the first embodiment of the present invention.

As illustrated in FIG. 1, an amplifying device 1 is connected to an audio device 2 that outputs an audio signal of a level having the degree of a line level.

The audio signal output from the audio device 2 is input to the amplifying device 1 as an input audio signal, amplified in power by an amplifier 14 that is a power amplifier stage disposed inside the amplifying device 1, and output to a speaker 3.

Also, the amplifying device 1 and the audio device 2 are electrically connected to a DC power supply 4 that supplies a power necessary to operate those units. There is no need to limit a power supply necessary to operate the respective units to the DC power supply, and an AC power supply may be appropriately used according to characteristics of the respective units.

The amplifying device 1 includes a supply voltage controller 11, a voltage variable power supply 12, a signal delay processor 13, the amplifier 14 that is a power amplifier state, an attenuator 15, and an A/D converter 16. The input audio signal input from the audio device 2 to the amplifying device 1 is input to the signal delay processor 13 and the supply voltage controller 11.

The signal delay processor 13 buffers the input audio signal for a predetermined time. A signal input to the supply voltage controller 11 in the same timing as that of the input of the input audio signal to the signal delay processor 13 is input to the voltage variable power supply 12 as a supply voltage control signal after the signal is processed by the supply voltage controller 11. The processing of the supply voltage controller 11 will be described in detail latter.

The voltage variable power supply 12 supplies, to the amplifier 14, a power of an output voltage value corresponding to the supply voltage control signal input from the supply voltage controller 11.

The amplifier 14 amplifies the audio signal input from the signal delay processor 13 by the aid of a power supplied from the voltage variable power supply 12, and outputs the amplified signal to the speaker 3 connected to the amplifying device 1. The speaker 3 converts the supplied power into a sound, and emits the sound.

The attenuator 15 attenuates an output voltage of the voltage variable power supply 12, and feeds the voltage to the supply voltage controller 11. The attenuator 15 is formed of a general component combined with a resistor.

The A/D converter 16 is a converter that converts the output voltage value of the voltage variable power supply 12, which is obtained as an analog signal attenuated by the attenuator 15, into a digital signal.

The supply voltage controller 11 includes a simplified envelope creating unit 111, an envelope signal delay processor 112, a read-ahead update unit 113, and a supply voltage control signal creating unit 114. The supply voltage controller 11 is realized by a digital signal processor (DSP) or a microcontroller. Also, the signal delay processor 13 is also realized by a digital signal processor (DSP) and a microcontroller.

The voltage variable power supply 12 is a switching power supply, and a power supply that outputs a power of a voltage value corresponding to the supply voltage control signal input from the supply voltage controller 11.

The amplifier 14 is a class D amplifier which includes a PWM generator 141, a gate driver 142, a half bridge circuit 143, and a low-pass filter 144. The amplifier 14 amplifies the audio signal input from the signal delay processor 13 with an amplification degree A.

The operation of the amplifying device 1 configured as described above will be described.

When the audio signal is input from the audio device 2 to the amplifying device 1, the input audio signal is input to the signal delay processor 13 and the simplified envelope creating unit 111 in the supply voltage controller 11.

The simplified envelope creating unit 111 processes the input audio signal input from the audio device 2 to create the simplified envelope signal of the input audio signal.

When the digital signals are assumed as analog signals connecting signal values of the digital signals for convenience, the simplified envelope signal is defined as follows. The amplitude of the simplified envelope signal does not fall below the amplitude of the input audio signal. Also, in the rising edge and the falling edge of the simplified envelope signal, a first rising edge rises along the input audio signal, and the falling edge falls along the input audio signal or gently more than the input audio signal. The falling edge again rises along the input audio signal from a portion where the falling edge overlaps with the input audio signal.

The simplified envelope signal created by the simplified envelope creating unit 111 is output to the envelope signal delay processor 112 and the supply voltage control signal creating unit 114.

The envelope signal delay processor 112 buffers the simplified envelope signal for a period described below, for the purpose of temporarily saving the simplified envelope signal.

The above period is a time since the simplified envelope signal is input to the supply voltage control signal creating unit 114 until the supply voltage control signal creating unit 114 processes the simplified envelope signal and outputs the supply voltage control signal, the voltage variable power supply 12 outputs the power of the voltage value corresponding to the supply voltage control signal, the attenuator 15 attenuates the output voltage to 1/A, the A/D converter 16 converts the attenuated analog signal into the digital signal, and the digital signal is input to the read-ahead update unit 113.

Thus, the envelope signal delay processor 112 saves the simplified envelope signal during the above period, whereby timing when the digital signal output from the ND converter 16 is input to the read-ahead update unit 113 can be synchronized with timing when the simplified envelope signal is buffered by the envelope signal delay processor 112 and input to the read-ahead update unit 113, for the simplified envelope signal input from the simplified envelope creating unit 111 to the envelope signal delay processor 112 and the supply voltage control signal creating unit 114 at the same time.

As described above, the read-ahead update unit 113 receives the simplified envelope signal from the envelope signal delay processor 112. At the same time, the read-ahead update unit 113 receives the digital signal obtained by subjecting the signal resulting from attenuating the output voltage of the voltage variable power supply 12 to 1/A by the attenuator 15, to ND conversion by the ND converter 16. A is an amplification degree of the amplifier 14.

The read-ahead update unit 113 compares the input simplified envelope signal with the digital signal indicative of a voltage value obtained by attenuating the output signal from the voltage variable power supply 12 to 1/A, which is input from the ND converter 16. The read-ahead update unit 113 then updates the read-ahead width on the basis of a comparison result as will be described later, and outputs the updated read-ahead width to the supply voltage control signal creating unit 114.

The read-ahead width will be described. When the digital signals are assumed as analog signals connecting signal values of the digital signals for convenience, the supply voltage controller 11 controls the supply voltage control signal output to the voltage variable power supply 12 by the supply voltage control signal creating unit 114 to rise ahead of the audio signal amplified by the amplifier 14. The read-ahead width is a time width between a rising time of the audio signal and a rising time of the supply voltage control signal. In this embodiment, there is provided no read-ahead width for the falling edge of the supply voltage control signal.

Thus, in this embodiment, the input audio signal that is an audio signal input from the external is delayed for a predetermined time by the signal delay processor 13, and thereafter amplified by the amplifier 14. To the amplifier 14, the power of the voltage value based on the control signal output before a constant time prior to the predetermined time is supplied. The "constant time" is the time width represented by the read-ahead width.

The read-ahead update unit 113 compares the simplified envelope signal with the digital signal indicative of the voltage value obtained by attenuating the output signal from the voltage variable power supply 12 to 1/A, which is input from the ND converter 16. The read-ahead update unit 113 then updates the read-ahead width as described above. For that reason, the read-ahead update unit 113 can deal with a change in the slew rate of the voltage variable power supply 12. As a result, the audio signal is not distorted in the amplifier 14, and the high power efficiency of the voltage variable power supply 12 can be kept.

The supply voltage control signal creating unit 114 creates the supply voltage control signal on the basis of the read-ahead width input from the read-ahead update unit 113 and the simplified envelope signal input from the simplified envelope creating unit 111 as will be described later, and outputs the supply voltage control signal to the voltage variable power supply 12.

The voltage variable power supply 12 outputs a positive supply voltage (+V) and a negative supply voltage (−V) with a value indicated by the supply voltage control signal input from the supply voltage control signal creating unit 114 as a target voltage value.

The positive supply voltage is applied to a high-side high-speed switching element 143a disposed at a high potential power supply side of the half bridge circuit 143 disposed within the amplifier 14. At the same time, the positive supply voltage is attenuated to 1/A by the attenuator 15, converted into the digital signal by the A/D converter 16, and then processed by the read-ahead update unit 113.

The negative supply voltage is applied to a low-side high-speed switching element 143b disposed at a low potential power supply side of the half bridge circuit 143 disposed within the amplifier 14.

While the input audio signal is being processed by the supply voltage controller 11, the signal delay processor 13 delays the input audio signal by a difference time between a time required for processing in the supply voltage controller 11 and the voltage variable power supply 12 and a time required for processing in the PWM generator 141 and the gate driver 142.

That is, the signal delay processor 13 operates as a buffer that absorbs a difference between a time until the input audio signal is processed within the amplifier 14 and arrives at the half bridge circuit 143, and a time until the input audio signal is processed by the supply voltage controller 11, and supplied from the voltage variable power supply 12 to the half bridge circuit 143.

The input audio signal delayed by the signal delay processor 13 is output to the PWM generator 141. The PWM generator 141 converts the received input audio signal into a PWM signal, and outputs the PWM signal. As a system of PWM conversion, ΔΣ conversion system or a PWM generation system using comparison of chopping waves has been known. In this embodiment, any one of those systems is applied.

The PWM signal output from the PWM generator 141 is input to the gate driver 142. The gate driver 142 inputs a drive signal for driving the half bridge circuit 143 to the half bridge circuit 143.

The gate driver 142 amplifies the PWM signal to a power having the degree that can drive the high-side high-speed switching element 143a and the low-side high-speed switching element 143b in the half bridge circuit 143.

The half bridge circuit 143 includes the high-side high-speed switching element 143a disposed at the high potential power supply side and the low-side high-speed switching element 143b disposed at the low potential power supply (or ground) side in the half bridge circuit 143. A positive power supply is supplied to the high-side high-speed switching element 143a from the voltage variable power supply 12, and a negative power supply is supplied to the low-side high-speed switching element 143b from the voltage variable power supply 12. The high-side high-speed switching element 143a and the low-side high-speed switching element 143b conducts the switching operation between the positive supply voltage (+V) value and the negative supply voltage (−V) value according to the drive signal input from the gate driver 142.

The output signal of the half bridge circuit 143 is a signal obtained by amplifying the amplification of the PWM signal output from the PWM generator 141 to A times which is the amplification degree of the amplifier 14. The high-side high-speed switching element 143a and the low-side high-speed switching element 143b are each formed of, for example, a MOS field effect transistor.

The output signal of the half bridge circuit 143, which is the PWM signal, is filtered by the low-pass filter 144 and converted into the analog audio signal. The analog audio signal is output to the speaker 3.

Hereinafter, the detailed processing contents of the above-mentioned supply voltage control signal creating unit 114 will be described. In the following description, it is assumed that the input audio signal is the digital signal, x, N, and n are dealt with as integers, and x is dealt with as time. Also, a description will be given assuming that values indicated by the input digital signals are data f(x) at time x in the input order, a data length of continuous N points is one frame, and each frame is processed as an n-th frame in the input order. Also, in FIGS. 3, 5, 7, and 8 which are wavelength diagrams of the digital signals corresponding to the following description, the waveforms are illustrated as analog waveforms connecting the signal values of the digital signals for convenience.

<Description of the Processing Operation for Creating the Supply Voltage Control Signal on the Basis of the Simplified Envelope Signal and the Read-Ahead Width>

First, the processing operation for creating the simplified envelope by the simplified envelope creating unit 111 will be described. The simplified envelope creating unit 111 obtains a simplified envelope g(x) from an input audio signal f(x) in the following procedure. The g(x) is a signal value of the simplified envelope at the time x.

Figure 2:
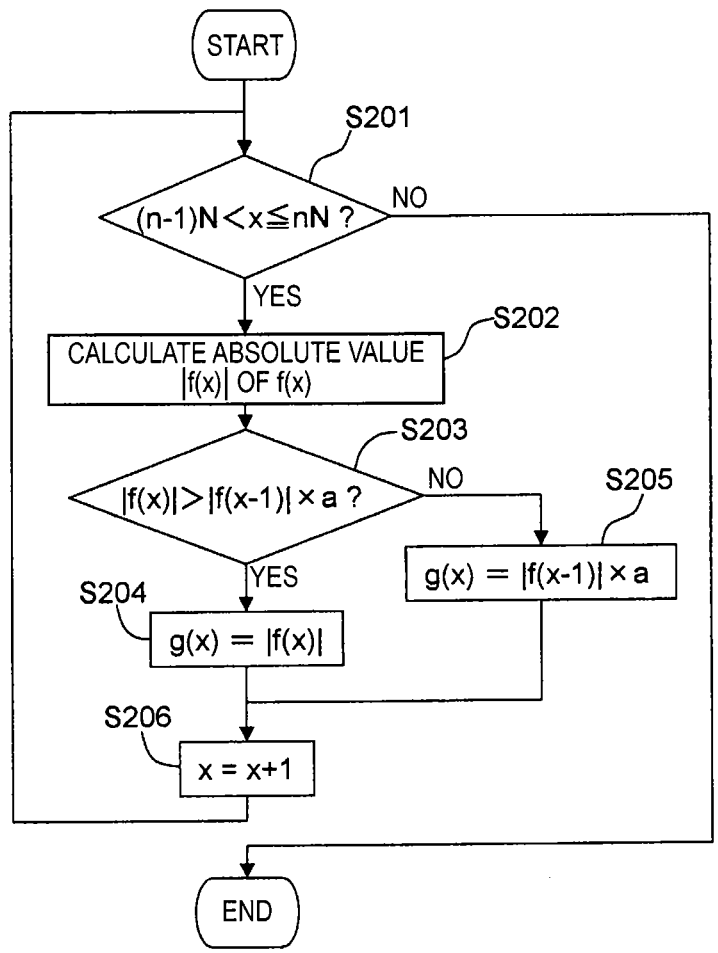
FIG. 2 is a flowchart of processing conducted by a simplified envelope creating unit according to the first embodiment of the present invention.

FIG. 2 is a flowchart of processing conducted by the simplified envelope creating unit 111 according to the first embodiment. As illustrated in FIG. 2, in the processing of an n-th frame, the simplified envelope creating unit 111 determines whether (n−1)N<x≤nN is met, or not (Step S201), and calculates an absolute value |f(x)| of the input signal f(x) if (n−1)N<x≤nN is met (Step S202). If (n−1)N<x≤nN is not met, the simplified envelope creating unit 111 completes this processing.

Subsequently, the simplified envelope creating unit 111 compares |f(x)| with a value (|f(x−1)|x a) obtained by multiplying a value |f(x−1)| immediately before |f(x)| by a coefficient a (Step S203), and sets a larger value as g(x) (Steps S204 and S205). Then, the simplified envelope creating unit 111 updates x (Step S206). The coefficient a is a value for determining a falling slope of the simplified envelope g(x), and determined according to a maximum slew rate of the falling edge of the voltage variable power supply 12.

A reason for using the maximum slew rate of the falling edge of the voltage variable power supply 12 in order to determine the falling slope of the simplified envelope signal g(x) will be described. If the slew rate of the voltage variable power supply 12 is decreased by the load fluctuation, the output voltage of the voltage variable power supply 12 falls according to the slew rate of the voltage variable power supply 12 not depending on the supply voltage control signal with respect to the falling edge of the supply voltage control signal, and the voltage value does not fall below the amplitude value of the audio signal. Therefore, the audio signal is not distorted. Accordingly, in order to determine the falling slope of the simplified envelope g(x), the maximum slew rate of the falling edge of the voltage variable power supply 12 is used.

Figure 3:
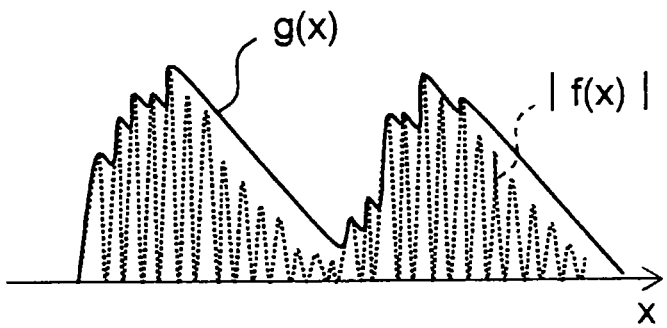
FIG. 3 is a diagram illustrating an example of a simplified envelope according to the first embodiment of the present invention.

FIG. 3 is a diagram illustrating an example of a simplified envelope according to the first embodiment.

The simplified envelope creating unit 111 processes the input audio signal as described above to create the simplified envelope signal of the simplified envelope g(x) whose rising edge arises along |f(x)|, and whose falling edge falls according to the coefficient a.

Next, a processing operation of the supply voltage control signal creating unit 114 will be explained. The supply voltage control signal creating unit 114 creates a supply voltage control signal h(x) according to a simplified envelope g(x) input from the simplified envelope creating unit 111 and a read-ahead width b(n) input from the read-ahead update unit 113 as the following procedures.

Figure 4:
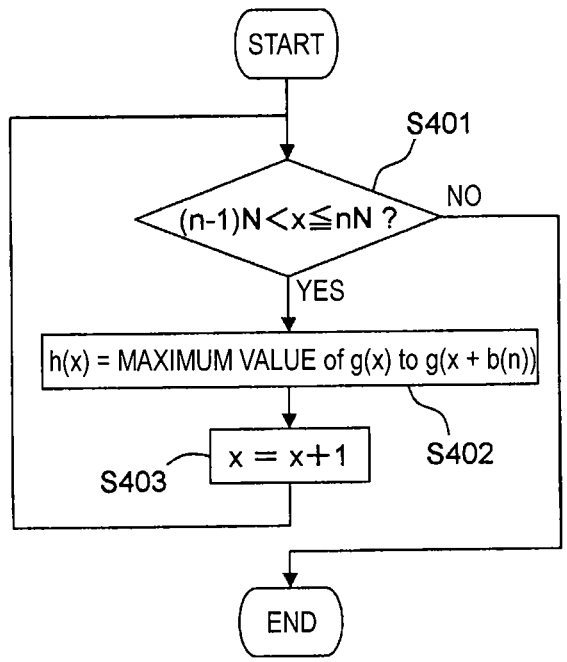
FIG. 4 is a flowchart of processing conducted by a supply voltage control signal creating unit according to the first embodiment of the present invention.
Figure 5:
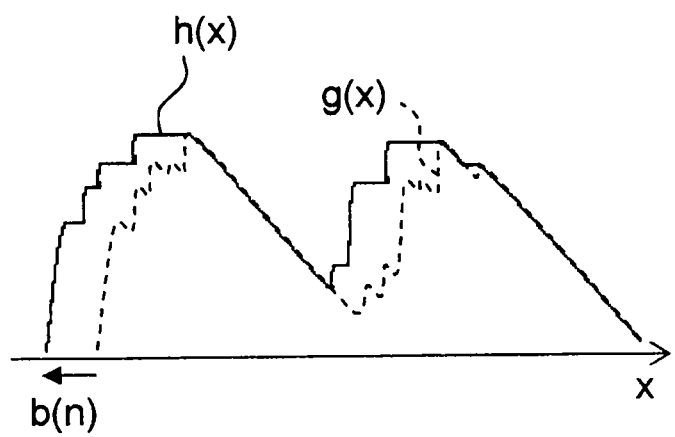
FIG. 5 is a diagram illustrating an example of a supply voltage control signal according to the first embodiment of the present invention.

FIG. 4 is a flowchart of processing conducted by the supply voltage control signal creating unit 114 according to the first embodiment. FIG. 5 is a diagram illustrating an example of a supply voltage control signal according to the first embodiment. As illustrated in FIG. 4, in the processing of the n-th frame, the supply voltage control signal creating unit 114 determines whether (n−1)N<x≤nN is met, or not (Step S401), and sets a maximum value of the simplified envelopes g(x) to g(x+b(n)) as h(x) (Step S402) if (n−1)N<x≤nN is met (Step S402). If (n−1)N<x≤nN is not met, the supply voltage control signal creating unit 114 completes this processing. Subsequent to Step S402, the supply voltage control signal creating unit 114 updates x (Step S403).

As a result of the processing by the supply voltage control signal creating unit 114, as illustrated in FIG. 5, h(x) rises ahead of the simplified envelope g(x) by the read-ahead width b(n). A local maximum point of the maximum value h(x) of the simplified envelopes g(x) to g(x+b(n)) is held to a local maximum point of the simplified envelope g(x), and the falling edge is curved along the simplified envelope g(x). The h(x) is output from the supply voltage control signal creating unit 114 to the voltage variable power supply 12 as the supply voltage control signal.

The voltage variable power supply 12 outputs the positive supply voltage v(x) with a value obtained by multiplying a value of the supply voltage control signal h(x) input from the supply voltage control signal creating unit 114 by the amplification degree A of the amplifier 14 as a target voltage value, and simultaneously outputs the negative supply voltage −v(x) which is equal in amplitude to and reverse in sign to the positive supply voltage v(x).

In this embodiment, as described above, the supply voltage control signal creating unit 114 creates the supply voltage control signal h(x) according to the simplified envelope g(x) and the read-ahead width b(n).

<Description of the Processing Operation for Updating the Read-Ahead Width>

Figure 6:
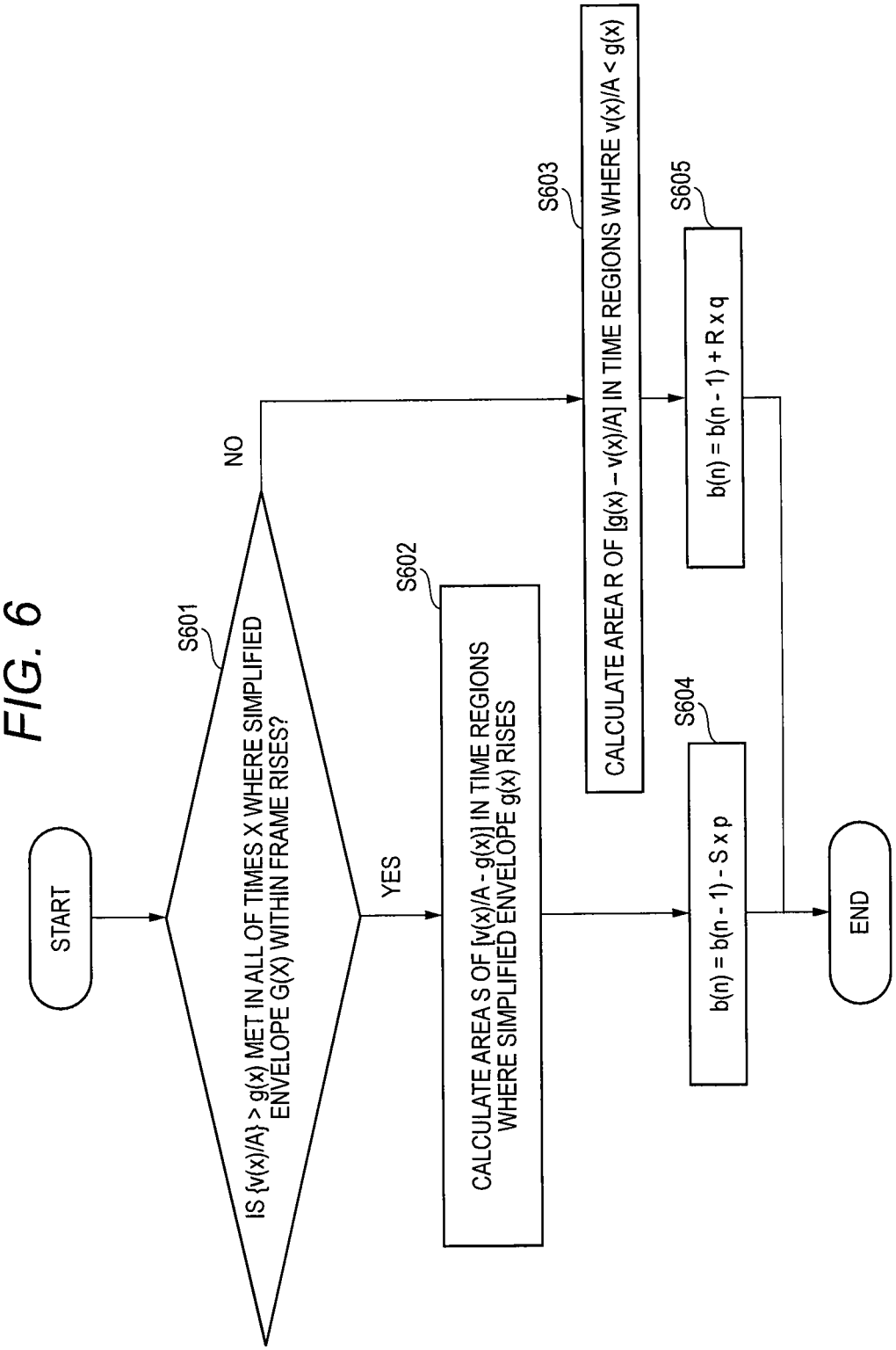
FIG. 6 is a flowchart of processing conducted by a read-ahead width update unit according to the first embodiment of the present invention.
Figure 7:
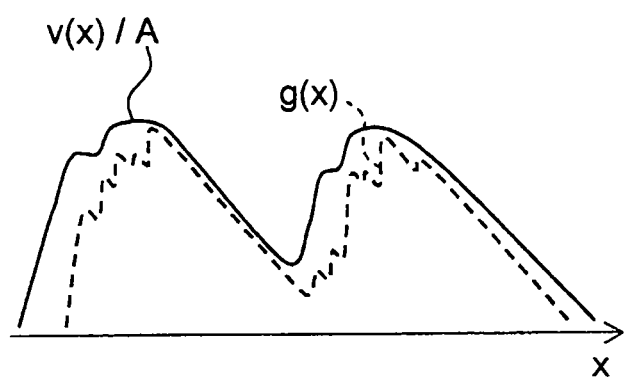
FIG. 7 is a diagram illustrating one example of an input signal to the read-ahead width update unit according to the first embodiment of the present invention.
Figure 8:
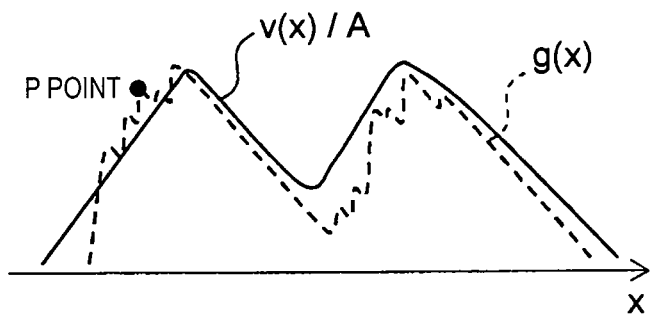
FIG. 8 is a diagram illustrating another example of an input signal to the read-ahead width update unit according to the first embodiment of the present invention.

FIG. 6 is a flowchart of processing conducted by the read-ahead width update unit 113 according to the first embodiment. Also, FIG. 7 is a diagram illustrating one example of an input signal to the read-ahead width update unit 113 according to the first embodiment. FIG. 8 is a diagram illustrating another example of the input signal to the read-ahead width update unit 113 according to the first embodiment.

The read-ahead update unit 113 updates the read-ahead width b(n) on the basis of the voltage value obtained by attenuating the positive supply voltage v(x) output from the voltage variable power supply 12 to 1/A, and the value of the simplified envelope g(x) created by the simplified envelope creating unit 111. The read-ahead width b(n) is a read-ahead width used in the n-th frame.

As illustrated in FIG. 6, the read-ahead update unit 113 separately conducts the following two kinds of processing according to the results of comparing the voltage value obtained by attenuating the positive supply voltage v(x) to 1/A with the value of the simplified envelope g(x). That is, the read-ahead update unit 113 determines whether {v(x)/A} is larger than g(x), or not, at all of times x when the simplified envelope g(x) within the frame rises (Step S601).

As illustrated in FIG. 7, if {v(x)/A}>g(x) is met in all of time regions where the simplified envelope g(x) rises within the frame (that is, determination in Step S601 is yes), the output voltage of the voltage variable power supply 12 rises ahead of the sound signal amplified by the amplifier 14. In this situation, the rising edge of the output voltage from the voltage variable power supply 12 can be delayed with a decrease in the read-ahead width b(n).

Therefore, the read-ahead update unit 113 calculates an area S of a difference between {v(x)/A} and g(x) in the time regions where the simplified envelope g(x) rises (Step S602). Then, the read-ahead update unit 113 decreases the read-ahead width b(n) by application of [b(n)=b(n−1)−S×p] with a weight coefficient p of the area S to the read-ahead width b(n) as a positive constant (Step S604).

On the other hand, as illustrated in FIG. 8, in the time region where the simplified envelope g(x) rises within the frame, for example, if there is a portion of {v(x)/A}<g(x) such as a point P in FIG. 8 (that is, determination in Step S601 is no), the rising edge of the output voltage from the voltage variable power supply 12 does not catch the sound signal amplified by the amplifier 14. In this situation, the read-ahead width b(n) is increased to advance the rising edge of the output voltage from the voltage variable power supply 12.

In order to achieve this, the read-ahead update unit 113 calculates an area R of a difference between {v(x)/A} and g(x) in the time regions where {v(x)/A}<g(x) is met (Step S603). Then, the read-ahead update unit 113 increases the read-ahead width b(n) by application of [b(n)=b(n−1)+R×p] with a weight coefficient q of the area R to the read-ahead width b(n) as a positive constant (Step S605).

Through the above processing, the read-ahead update unit 113 updates the read-ahead width b(n).

As described above, with comparison of the output voltage of the voltage variable power supply 12 with the simplified envelope signal, the read-ahead width is so updated as to cope with the changed slew rate even if the slew rate of the voltage variable power supply 12 is changed. As a result, the audio signal is not distorted in the amplifier 14, and the high power efficiency of the voltage variable power supply 12 can be kept.

In the above manner, the supply voltage control signal h(x) is produced while the read-ahead width b(n) is updated, and the supply voltage control signal h(x) controls the output voltage of the voltage variable power supply 12 to follow the input audio signal. Therefore, the following supply voltage control can be conducted without distorting the output signal of the amplifying device 1. There is no need to consider the fixed headroom set for the supply voltage applied from the voltage variable power supply 12 to the half bridge circuit 143 of the DC power supply 4. Also, even if the slew rate of the voltage variable power supply 12 fluctuates due to the load fluctuation, the supply voltage control that allows the supply voltage to surely follow the input signal can be performed. For that reason, noise superimposed on the output signal of the amplifying device 1 can be reduced more than that in the conventional art. Also, the amplifying device 1 can be provided which improves the power efficiency of the voltage variable power supply 12.

As described above, according to the present invention, there is provided an amplifying device that amplifies an input audio signal input to the subject device and outputs a sound, the amplifying device including: a signal delay processor that outputs the input audio signal with a predetermined time of delay; an amplifier that amplifies a signal output from the signal delay processor; a voltage variable power supply that supplies a power to the amplifier; and a supply voltage controller that outputs a supply voltage control signal to the voltage variable power supply to control an output voltage of the voltage variable power supply, in which the supply voltage controller calculates an envelope of the input audio signal from the input audio signal to generate the supply voltage control signal so that a waveform of the supply voltage control signal follows the envelope, and outputs the supply voltage control signal to the voltage variable power supply before a constant time prior to the predetermined time.

In a comparison of the supply voltage control signal input to the voltage variable power supply with the output voltage of the voltage variable power supply, the output voltage may be delayed relative to the supply voltage control signal, but is not advanced. Hence, in the rising edge of the signals, the supply voltage control signal is smaller than the output voltage. Therefore, in order to keep the output voltage of the voltage variable power supply larger than the output signal of the amplifying device, it is only necessary to advance only the rising edge of the signal. To achieve this, the supply voltage control signal under the control described above is created.

The present invention has been described with reference to specific embodiments, but it would be apparent to an ordinary skilled person that various modifications and corrections could be conducted without departure from the spirit and scope of the present invention.

The present invention is based on Japanese Patent Application No. 2010-001695 filed on Jan. 7, 2010, and content thereof is incorporated herein by reference.

INDUSTRIAL APPLICABILITY

In the amplifying device according to the present invention, the headroom provided in the supply voltage of the amplifier stage is reduced so as not to distort the output signal of the amplifying device, and even when the performance of the voltage variable power supply fluctuates due to the load fluctuation, the supply voltage control that allows the supply voltage to surely follow the input signal can be performed. For that reason, noise superimposed on the output signal of the amplifying device can be reduced more than that in the conventional art. Also, the amplifying device can be provided which improves the power efficiency of the voltage variable power supply. Thus, the present invention relates to the amplifying device that amplifies the power of the input signal, and is useful as the amplifying device that conducts the supply voltage control of the supply power in the power amplifier stage of the signal.

REFERENCE SIGN LIST

1, amplifying device
2, audio device
3, speaker
4, DC power supply
11, supply voltage controller
12, voltage variable power supply
13, signal delay processor
14, amplifier
15, attenuator
16, ND converter
111, simplified envelope creating unit
112, envelope signal delay processor
113, read-ahead update unit
114, supply voltage control signal creating unit
141, PWM generator
142, gate driver
143, half bridge circuit
143a, high-side high-speed switching element
143b, low-side high-speed switching element
144, low-pass filter

The invention claimed is:

1. An amplifying device which amplifies an input audio signal input to the amplifying device to outputs a sound, the amplifying device comprising:
a signal delay processor that outputs the input audio signal with a predetermined time of delay;

an amplifier that amplifies a signal output from the signal delay processor;
a voltage variable power supply that supplies a power to the amplifier; and
a supply voltage controller including:
　a simplified envelope creating unit that calculates an envelope of the input audio signal,
　a read-ahead update unit that generates a read-ahead signal, and
　a supply voltage control signal creating unit that generates a supply voltage control signal,
wherein:
　the read-ahead update unit generates the read-ahead signal indicating a specified time delay based on a comparison between the envelope and the output voltage of the voltage variable power supply, the time delay being decreased when the output voltage of the voltage variable power supply is greater than the envelope, and the time delay being increased when the output of the voltage variable power supply is less than the envelope, and
　the read-ahead signal controls the supply voltage control signal creating unit to generate the supply voltage control signal with the specified time delay to follow the envelope of the input audio signal, and output the supply voltage control signal to the voltage variable power supply.

2. The amplifying device according to claim 1, wherein the supply voltage controller controls the supply voltage control signal to rise ahead of the audio signal to be amplified by the amplifier.

3. The amplifying device according to claim 2, wherein the supply voltage controller sets the constant time to zero in a falling edge of the supply voltage control signal.

* * * * *